United States Patent
Johnson et al.

(10) Patent No.: US 11,468,938 B2
(45) Date of Patent: Oct. 11, 2022

(54) MEMORY WITH PROGRAMMABLE REFRESH ORDER AND STAGGER TIME

(71) Applicant: Micron Technology, Inc., Boise, ID (US)

(72) Inventors: Vaughn N. Johnson, Boise, ID (US); Debra M. Bell, Boise, ID (US); Miles S. Wiscombe, Boise, ID (US); Brian T. Pecha, Boise, ID (US); Kyle Alexander, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/096,469

(22) Filed: Nov. 12, 2020

(65) Prior Publication Data

US 2022/0148647 A1    May 12, 2022

(51) Int. Cl.
*G11C 11/406* (2006.01)
*G11C 11/408* (2006.01)
*G11C 11/4076* (2006.01)

(52) U.S. Cl.
CPC ...... *G11C 11/40615* (2013.01); *G11C 11/408* (2013.01); *G11C 11/4076* (2013.01); *G11C 11/40611* (2013.01); *G11C 11/40618* (2013.01); *G11C 11/40622* (2013.01)

(58) Field of Classification Search
CPC ......... G11C 11/40611; G11C 11/40615; G11C 11/40618; G11C 11/40622; G11C 11/4076; G11C 11/408

USPC ......................................................... 365/222
See application file for complete search history.

(56) References Cited

U.S. PATENT DOCUMENTS

| | | | |
|---|---|---|---|
| 6,324,113 B1 * | 11/2001 | Tomita ................. | G11C 11/406 365/222 |
| 6,426,909 B1 * | 7/2002 | Tomita ................. | G11C 11/406 365/222 |
| 6,754,126 B2 * | 6/2004 | Yamaguchi ......... | G11C 7/1006 365/220 |
| 9,575,663 B2 * | 2/2017 | Shim ................. | G11C 11/40615 |

* cited by examiner

*Primary Examiner* — Son L Mai
(74) *Attorney, Agent, or Firm* — Perkins Coie LLP

(57) ABSTRACT

Memory devices and systems with programmable refresh order and stagger times are disclosed herein. In one embodiment, a memory device includes a first memory bank group and a second memory bank group. The memory device is configured, in response to a refresh command, to perform a first refresh operation on the first memory bank group at a first time and a second refresh operation on the second memory bank group at a second time after the first time. The memory device is further configured to perform, in response to a read or write command, a read or write operation on the first memory bank group, the second memory bank group, or both the first and second memory bank groups after beginning the first refresh operation and before completing the second refresh operation.

20 Claims, 5 Drawing Sheets

MEMORY WITH PROGRAMMABLE REFRESH ORDER AND STAGGER TIME

TECHNICAL FIELD

The present disclosure is related to memory systems, devices, and associated methods. In particular, the present disclosure is related to memory devices with programmable refresh order and programmable refresh stagger time.

BACKGROUND

Memory devices are widely used to store information related to various electronic devices such as computers, wireless communication devices, cameras, digital displays, and the like. Memory devices are frequently provided as internal, semiconductor, integrated circuits and/or external removable devices in computers or other electronic devices. There are many different types of memory, including volatile and non-volatile memory. Volatile memory, including static random access memory (SRAM), dynamic random access memory (DRAM), and synchronous dynamic random access memory (SDRAM), among others, may require a source of applied power to maintain its data. Non-volatile memory, by contrast, can retain its stored data even when not externally powered. Non-volatile memory is available in a wide variety of technologies, including flash memory (e.g., NAND and NOR) phase change memory (PCM), ferroelectric random access memory (FeRAM), resistive random access memory (RRAM), and magnetic random access memory (MRAM), among others. Improving memory devices, generally, may include increasing memory cell density, increasing read/write speeds or otherwise reducing operational latency, increasing reliability, increasing data retention, reducing power consumption, or reducing manufacturing costs, among other metrics.

BRIEF DESCRIPTION OF THE DRAWINGS

Many aspects of the present disclosure can be better understood with reference to the following drawings. The components in the drawings are not necessarily to scale. Instead, emphasis is placed on illustrating clearly the principles of the present disclosure. The drawings should not be taken to limit the disclosure to the specific embodiments depicted, but are for explanation and understanding only.

DETAILED DESCRIPTION

Figure 1:
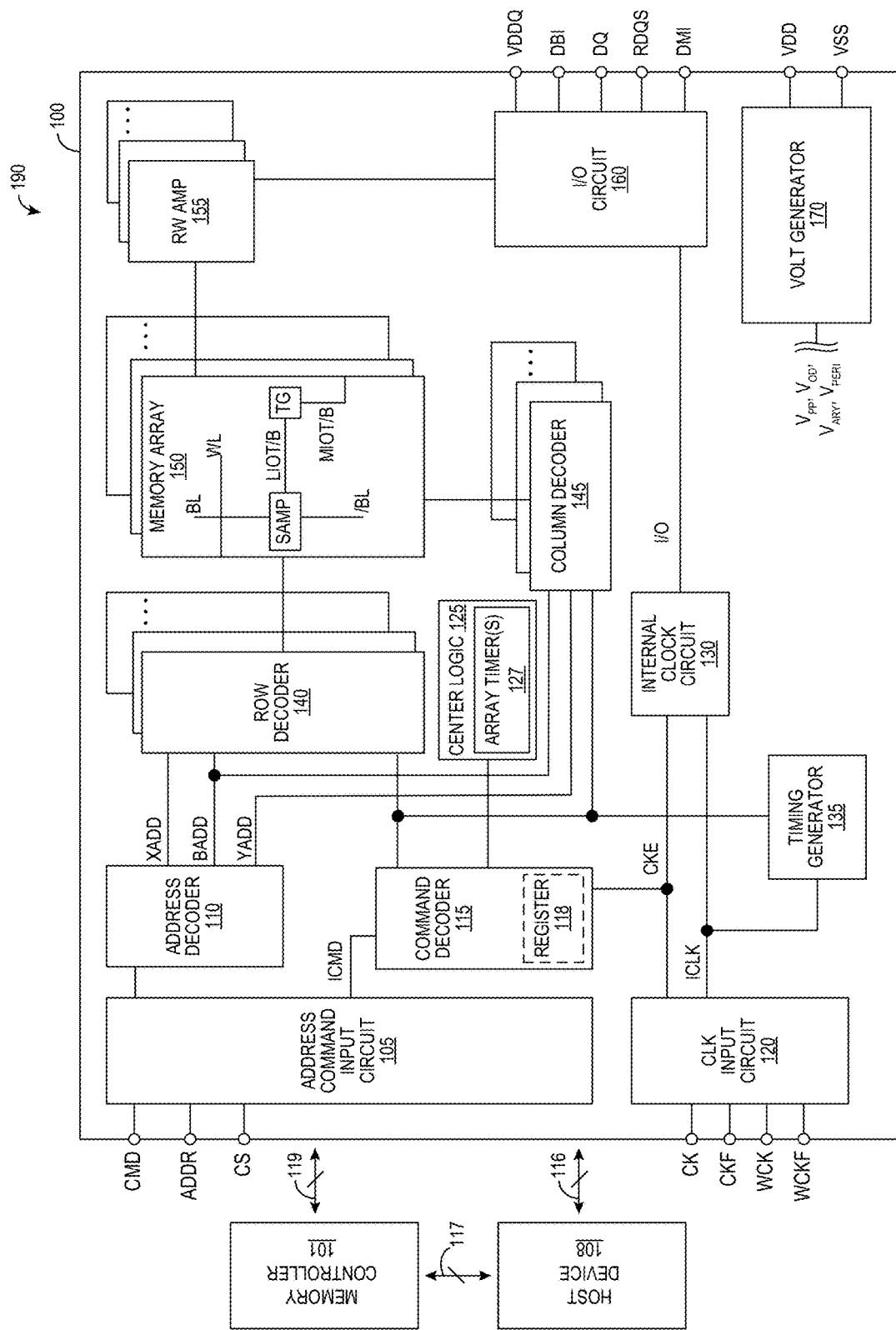
FIG. 1 is a block diagram schematically illustrating a memory system configured in accordance with various embodiments of the present technology.

Memory devices, such as DRAM devices, utilize refresh operations to keep data from being corrupted by, for example, charge leakage or other effects that can degrade data over time. Often, the memory devices perform refresh operations in response to receiving a refresh command (e.g., from a memory controller). One such refresh command is a refresh all banks command REFab. In response to receiving a refresh all banks command REFab, a memory device proceeds to perform several refresh operations to refresh all of the memory banks of its memory array over a time period tRFC1. The memory device often staggers these refresh operations to reduce peak power consumed by the memory device, meaning that the memory banks of the memory device are refreshed at different points in time during the time period tRFC1. Furthermore, the memory device locks the memory array such that memory banks of the memory device are not accessible for reading or writing data during the time period tRFC1. Thus, the total time the memory array of the memory device is available for reading and writing data is reduced whenever a refresh all banks command REFab is issued, even though several memory banks of the memory array are idle (e.g., are not currently being accessed) and are not the subject of refresh operations for at least a portion of the time period tRFC1.

To address this concern and increase the total time the memory array of a memory device is available for reading and writing data, memory systems and devices of the present technology can execute commands (e.g., precharge, write, read, and/or other commands) on select memory banks and/or on select memory bank groups of the memory arrays that are idle and are not currently the subject of refresh operations while the memory devices perform refresh operations on other memory banks and/or other memory bank groups of the memory arrays in response to receiving a refresh all banks command REFab. In some embodiments, the memory systems and devices can program an order (a refresh order) in which memory banks and/or memory bank groups of the memory arrays are refreshed. Such capability can provide flexibility as to when specific memory banks and/or memory bank groups remain or become accessible after a refresh all banks command REFab is received. For example, a memory device of the present technology can be selectively programmed to, in response to receiving a refresh all banks command REFab, perform (e.g., initiate and/or execute) a refresh operation on a second memory bank group after performing (e.g., initiating and/or executing) a refresh operation on a first memory bank group. In this example, the second memory bank group can remain accessible for reading and writing data for a period of time after the memory device receives the refresh all banks command REFab while the memory device performs a refresh operation on the first memory bank group and until the memory device performs a refresh operation to refresh the second memory bank group. Additionally or alternatively, the first memory bank group can become accessible for reading and writing data after the memory device completes a refresh operation on the first memory bank group and while the memory device performs a refresh operation on the second memory bank group. In some embodiments, the memory device can be selectively reprogrammed to, in response to receiving a refresh all banks command REFab, perform a refresh operation on the first memory bank group after performing a refresh operation on the second memory bank group. In such an example, the first memory bank group can remain accessible for reading and writing data for a period of time after the memory device receives the refresh all banks command REFab, and/or the second memory bank group can become accessible for reading and writing data after the memory device performs a refresh operation on the second memory bank group.

In these and other embodiments, memory systems and devices of the present technology can selectively program time periods (stagger times) between refresh operations on memory banks and/or on memory bank groups. Such capability can provide flexibility as to the timing of when and/or for how long specific memory banks and/or memory bank groups remain or become accessible after a refresh all banks command REFab is received. For example, a memory device of the present technology can be selectively programmed to, in response to receiving a refresh all banks command REFab, perform (e.g., initiate and/or execute) a refresh operation on a second memory bank group a specified time period after performing (e.g., initiating and/or executing) a refresh operation on a first memory bank group. In this example, a period of time the second memory bank group remains accessible for reading or writing data after the refresh all banks command REFab is received can be at least in part dependent on the specified time period. In other words, as the specified time period increases in duration, the second memory bank group can remain accessible for reading or writing data for longer periods of time after the memory device receives a refresh all banks command REFab. Additionally or alternatively, as the specified time period decreases in duration, the second memory bank group can remain accessible for reading or writing data for shorter periods of time after the memory device receives a refresh all banks command REFab, and/or the memory device can perform a refresh operation on the second memory bank group sooner such that the second memory bank group can become accessible for reading or writing data more quickly after being refreshed.

A person skilled in the art will understand that the technology may have additional embodiments and that the technology may be practiced without several of the details of the embodiments described below with reference to FIGS. 1-6. In the illustrated embodiments below, the memory devices and systems are primarily described in the context of devices incorporating DRAM storage media. Memory devices configured in accordance with other embodiments of the present technology, however, can include other types of memory devices and systems incorporating other types of storage media, including PCM, SRAM, FRAM, RRAM, MRAM, read only memory (ROM), erasable programmable ROM (EPROM), electrically erasable programmable ROM (EEROM), ferroelectric, magnetoresistive, and other storage media, including non-volatile, flash (e.g., NAND and/or NOR) storage media.

As used herein, the term "refresh" refers to various maintenance operations that can be performed on one or more memory cells of memory devices configured in accordance with various embodiments of the present technology. In some embodiments, the term "refresh" can refer to maintenance operations performed on one or more memory cells to maintain their data. For example, in the context of DRAM and other memory devices, the term "refresh" can refer to reading data from the one or more memory cells and rewriting the data to the one or more memory cells to increase the charge stored on the one or more memory cells to ameliorate charge leakage and to prevent data loss. In these and other embodiments, the term "refresh" can refer to reading data from the one or more memory cells and rewriting the data to the one or more memory cells in an inverted or other data state (e.g., from high to low or low to high), to ameliorate hysteresis shift, material depolarization, imprint and/or wear effects, or the like. In these and still other embodiments, the term "refresh" can refer to other maintenance operations, such as reading data from one or more memory cells and rewriting the data to one or more memory cells at another/other memory location(s). The term "refresh operation" refers to one or more operations (e.g., to one or more auto refresh operations, to one or more self refresh operations, and/or to one or more row hammer refresh operations) during which one or more memory cells of a memory device are refreshed.

In the illustrated embodiments below, the memory devices and systems are, for the sake of clarity and understanding, primarily described in the context of programming refresh orders and refresh stagger times of memory bank groups, where each memory bank group includes a plurality of individual memory banks. The disclosure, however, is not so limited. A person of ordinary skill in the art will recognize that all or a subset of the technology disclosed herein can be implemented in the context of programming stagger orders and/or stagger times of memory regions (e.g., individual memory banks, subsets of individual memory banks, memory rows, memory columns, memory cells, logical memory ranks, pluralities of memory bank groups, memory dies, memory devices, memory systems, etc.) other than memory bank groups and that such implementations fall within the scope of the present technology.

Furthermore, in the illustrated embodiments below, the memory devices and systems are, for the sake of clarity and understanding, primarily described in the context of refreshing every memory bank of a memory device in response to receiving a refresh all banks command REFab. The disclosure, however, is not so limited. A person or ordinary skill in the art will recognize that all or a subset of the technology disclosed herein can be implemented in the context of refreshing a subset of the memory banks of a memory device in response to receiving one or more refresh commands other than a refresh all banks command REFab and that such implementations fall within the scope of the present technology.

FIG. 1 is a block diagram schematically illustrating a memory system 190 configured in accordance with various embodiments of the present technology. The memory system 190 can include a memory device 100 (e.g., an individual memory die, a plurality of memory dies, etc.) that can be connected to any one of a number of electronic devices that is capable of utilizing memory for the temporary or persistent storage of information, or a component thereof. For example, the memory device 100 can be operably connected to a memory controller 101 (e.g., via an interface 119) and/or to a host device 108 (e.g., via an interface 116 and/or via the memory controller 101 and an interface 117). The host device 108 operably connected to the memory device 100 may be a computing device such as a desktop or portable computer, a server, a hand-held device (e.g., a mobile phone, a tablet, a digital reader, a digital media player), or some component thereof (e.g., a central processing unit, a co-processor, a dedicated memory controller, etc.). The host device 108 may be a networking device (e.g., a switch, a router, etc.) or a recorder of digital images, audio, and/or video; a vehicle; an appliance; a toy; or any one of a number of other products. In one embodiment, the host device 108 may be connected directly to the memory device 100, although in other embodiments, the host device 108 may be indirectly connected to the memory device 100 (e.g., over a networked connection or through intermediary devices, such as through the memory controller 101).

The memory device 100 can receive a plurality of signals (e.g., from the memory controller 101 and/or from the host device 108). In this regard, the memory device 100 may employ a plurality of external terminals that include command and address terminals coupled to a command bus and an address bus to receive command signals CMD and address signals ADDR, respectively, (e.g., from the memory controller 101 and/or from the host device 108). The memory device may further include a chip select terminal to receive a chip select signal CS, clock terminals to receive clock signals CK and CKF, data clock terminals to receive data clock signals WCK and WCKF, data terminals DQ, RDQS, DBI, and DMI, and power supply terminals VDD, VSS, and VDDQ.

The power supply terminals of the memory device 100 may be supplied with power supply potentials VDD and VSS. These power supply potentials VDD and VSS can be supplied to an internal voltage generator circuit 170. The internal voltage generator circuit 170 can generate various internal potentials VPP, VOD, VARY, VPERI, and the like based on the power supply potentials VDD and VSS. The internal potential VPP can be used in a row decoder 140, the internal potentials VOD and VARY can be used in sense amplifiers included in a memory array 150 of the memory device 100, and the internal potential VPERI can be used in many other circuit blocks.

The power supply terminals may also be supplied with power supply potential VDDQ. The power supply potential VDDQ can be supplied to an input/output (IO) circuit 160 together with the power supply potential VSS. The power supply potential VDDQ can be the same potential as the power supply potential VDD in an embodiment of the present technology. The power supply potential VDDQ can be a different potential from the power supply potential VDD in another embodiment of the present technology. However, the dedicated power supply potential VDDQ can be used for the IO circuit 160 so that power supply noise generated by the IO circuit 160 does not propagate to the other circuit blocks.

The clock terminals and data clock terminals may be supplied with external clock signals and complementary external clock signals. The external clock signals CK, CKF, WCK, WCKF can be supplied to a clock input circuit 120. The CK and CKF signals can be complementary, and the WCK and WCKF signals can also be complementary. Complementary clock signals can have opposite clock levels and transition between the opposite clock levels at the same time. For example, when a clock signal is at a low clock level a complementary clock signal is at a high level, and when the clock signal is at a high clock level the complementary clock signal is at a low clock level. Moreover, when the clock signal transitions from the low clock level to the high clock level the complementary clock signal transitions from the high clock level to the low clock level, and when the clock signal transitions from the high clock level to the low clock level the complementary clock signal transitions from the low clock level to the high clock level.

Input buffers included in the clock input circuit 120 can receive the external clock signals. For example, when enabled by a CKE signal from a command decoder 115, an input buffer can receive the CK and CKF signals and the WCK and WCKF signals. The clock input circuit 120 can receive the external clock signals to generate internal clock signals ICLK. The internal clock signals ICLK can be supplied to an internal clock circuit 130. The internal clock circuit 130 can provide various phase and frequency controlled internal clock signals based on the received internal clock signals ICLK and a clock enable signal CKE from the command decoder 115. For example, the internal clock circuit 130 can include a clock path (not shown in FIG. 1) that receives the internal clock signal ICLK and provides various clock signals (not shown) to the command decoder 115. The internal clock circuit 130 can further provide input/output (IO) clock signals. The IO clock signals can be supplied to the IO circuit 160 and can be used as a timing signal for determining an output timing of read data and the input timing of write data. The IO clock signals can be provided at multiple clock frequencies so that data can be output from and input into the memory device 100 at different data rates. A higher clock frequency may be desirable when high memory speed is desired. A lower clock frequency may be desirable when lower power consumption is desired. The internal clock signals ICLK can also be supplied to a timing generator 135 and thus various internal clock signals can be generated that can be used by the command decoder 115, the column decoder 145, and/or other components of the memory device 100.

The memory device 100 may include an array of memory cells, such as memory array 150. The memory cells of the memory array 150 may be arranged in a plurality of memory regions, and each memory region may include a plurality of word lines (WL), a plurality of bit lines (BL), and a plurality of memory cells arranged at intersections of the word lines and the bit lines. In some embodiments, a memory region can be one or more memory banks or another arrangement of memory cells (e.g., half memory banks, subarrays in a memory bank, etc.). In these and other embodiments, the memory regions of the memory array 150 can be arranged in one or more groups (e.g., one or more groups of memory banks, one or more logical memory ranks or dies, etc.). Memory cells in the memory array 150 can include any one of a number of different memory media types, including capacitive, magnetoresistive, ferroelectric, phase change, or the like. The selection of a word line WL may be performed by a row decoder 140, and the selection of a bit line BL may be performed by a column decoder 145. Sense amplifiers (SAMP) may be provided for corresponding bit lines BL and connected to at least one respective local I/O line pair (LIOT/B), which may in turn be coupled to at least respective one main I/O line pair (MIOT/B), via transfer gates (TG), which can function as switches. The memory array 150 may also include plate lines and corresponding circuitry for managing their operation.

The command terminals and address terminals may be supplied with an address signal and a bank address signal from outside the memory device 100 (e.g., from the memory controller 101 and/or from the host device 108). The address signal and the bank address signal supplied to the address terminals can be transferred, via a command/address input circuit 105, to an address decoder 110. The address decoder 110 can receive the address signals and supply a decoded row address signal (XADD) to the row decoder 140, and a decoded column address signal (YADD) to the column decoder 145. The address decoder 110 can also extract a bank address signal (BADD) and supply it to both the row decoder 140 and the column decoder 145.

The command and address terminals can be supplied with command signals CMD, address signals ADDR, and chip selection signals CS (e.g., from the memory controller 101 and/or the host device 108). The command signals may represent various memory commands (e.g., including access commands, which can include read commands and write commands, and refresh commands). The select signal CS may be used to select the memory device 100 to respond to commands and addresses provided to the command and address terminals. When an active CS signal is provided to the memory device 100, the commands and addresses can be decoded and memory operations can be performed. The command signals CMD may be provided as internal command signals ICMD to a command decoder 115 via the command/address input circuit 105. The command decoder 115 may include circuits to decode the internal command signals ICMD to generate various internal signals and commands for performing memory operations, for example, a row command signal to select a word line and a column command signal to select a bit line. The internal command signals can also include output and input activation commands, such as clocked command CMDCK (not shown) to the command decoder 115.

The command decoder 115 may further include one or more registers 118 for tracking various counts or values (e.g., counts of refresh commands received by the memory device 100 or self-refresh operations performed by the memory device 100) and/or for storing various operating conditions for the memory device 100 to perform certain functions, features, and modes (refresh modes, test modes, etc.). As such, in some embodiments, registers 118 (or a subset of the registers 118) may be referred to as mode registers. As described in greater detail below, the memory device 100 may be placed into a refresh mode by programming certain bits of the registers 118. Once the memory device 100 is placed into the refresh mode, the memory device 100 can use certain address bits received in address signals ADDR to determine an order (a refresh order) in which memory bank groups of the memory array 150 are refreshed in response to receiving a refresh all banks command REFab and/or to determine one or more time periods (one or more stagger times) between refresh operations on the memory bank groups after receiving the refresh all banks command REFab. Additionally or alternatively, the refresh order and/or the one or more stagger times can be specified by programming certain bits of the registers 118. In other words, the refresh order and/or the one or more stagger times can be programmed by utilizing the registers 118 of memory device 100 and/or by utilizing certain address bits of address signals ADDR received by the memory device 100.

When a read command is issued, and a row address and a column address are timely supplied with the read command, read data can be read from memory cells in the memory array 150 designated by these row address and column address. The read command may be received by the command decoder 115, which can provide internal commands to the IO circuit 160 so that read data can be output from the data terminals DQ, RDQS, DBI, and DMI via read/write (RW) amplifiers 155 and the IO circuit 160 according to the RDQS clock signals. The read data may be provided at a time defined by read latency information RL that can be programmed in the memory device 100, for example, in a mode register 118. The read latency information RL can be defined in terms of clock cycles of the CK clock signal. For example, the read latency information RL can be a number of clock cycles of the CK signal after the read command is received by the memory device 100 when the associated read data is provided.

When a write command is issued, and a row address and a column address are timely supplied with the command, write data can be supplied to the data terminals DQ, DBI, and DMI according to the WCK and WCKF clock signals. The write command may be received by the command decoder 115, which can provide internal commands to the IO circuit 160 so that the write data can be received by data receivers in the IO circuit 160, and supplied via the IO circuit 160 and the RW amplifiers 155 to the memory array 150. The write data may be written in the memory cell designated by the row address and the column address. The write data may be provided to the data terminals at a time that is defined by write latency WL information. The write latency WL information can be programmed in the memory device 100, for example, in the mode register 118. The write latency WL information can be defined in terms of clock cycles of the CK clock signal. For example, the write latency information WL can be a number of clock cycles of the CK signal after the write command is received by the memory device 100 when the associated write data is received.

The memory array 150 may be refreshed or maintained as described herein to prevent data loss, either due to charge leakage or imprint effects. A refresh operation, as described herein, may be initiated by the memory system 190 (e.g., by the host device 108, the memory controller 101, and/or the memory device 100), and may include accessing one or more rows (e.g., WL) and discharging cells of the accessed row to a corresponding SAMP. While the row is opened (e.g., while the accessed WL is energized), the SAMP may compare the voltage resulting from the discharged cell to a reference. The SAMP may then write back a logic value (e.g., charge the cell) to a nominal value for the given logic state. In some cases, this write back process may increase the charge of the cell to ameliorate the discharge issues discussed above. In other cases, the write back process may invert the data state of the cell (e.g., from high to low or low to high), to ameliorate hysteresis shift, material depolarization, or the like. Other refresh schemes or methods may also be employed.

In one approach, the memory device 100 may be configured to refresh the same row of memory cells in every memory bank of the memory array 150 simultaneously. In another approach, the memory device 100 may be configured to refresh the same row of memory cells in every memory bank of the memory array 150 sequentially. In still another approach, the memory device 100 can further include circuitry (e.g., one or more registers, latches, embedded memories, counters, etc.) configured to track row (e.g., word line) addresses, each corresponding to one of the memory banks in the memory array 150. In this approach, the memory device 100 is not constrained to refresh the same row in each memory bank of the memory array 150 before refreshing another row in one of the memory banks.

Regardless of the refresh approach, the memory device 100 can be configured to refresh memory cells in the memory array 150 within a given refresh rate or time window (e.g., 32 ms, 28 ms, 25 ms, 23 ms, 21 ms, 18 ms, 16 ms, 8 ms, etc.), known as tREF. In these embodiments, the memory system 190 (e.g., the memory controller 101, the host device 108, and/or the memory device 100) can be configured to supply refresh commands to the memory device 100 in accordance with a specified minimum cadence tREFI. For example, the memory system 190 can be configured to supply one or more refresh commands to the memory device 100 at least every 7.8 µs such that an approximate minimum of 4000 refresh commands are supplied to the memory device 100 within a 32 ms time window.

As shown in FIG. 1, the memory device 100 includes center logic circuitry 125. The center logic circuitry 125 includes one or more array timers 127. In some embodiments, the array timer(s) 127 include a central array timer that is shared amongst memory bank groups of the memory array 150 and that is initiated when the memory device 100 receives a refresh command. Additionally or alternatively, the array timer(s) 127 can include array timers dedicated to individual memory bank groups, a plurality of memory bank groups, a subset of memory banks within an individual memory bank group, etc. As discussed in greater detail below, the memory device 100 can utilize the central array timer and/or the other array timers 127 of the center logic circuitry 125 to determine when to perform refresh operations and/or when to perform other operations (e.g., row hammer refresh (RHR) operations) after receiving a refresh command.

Figure 2:
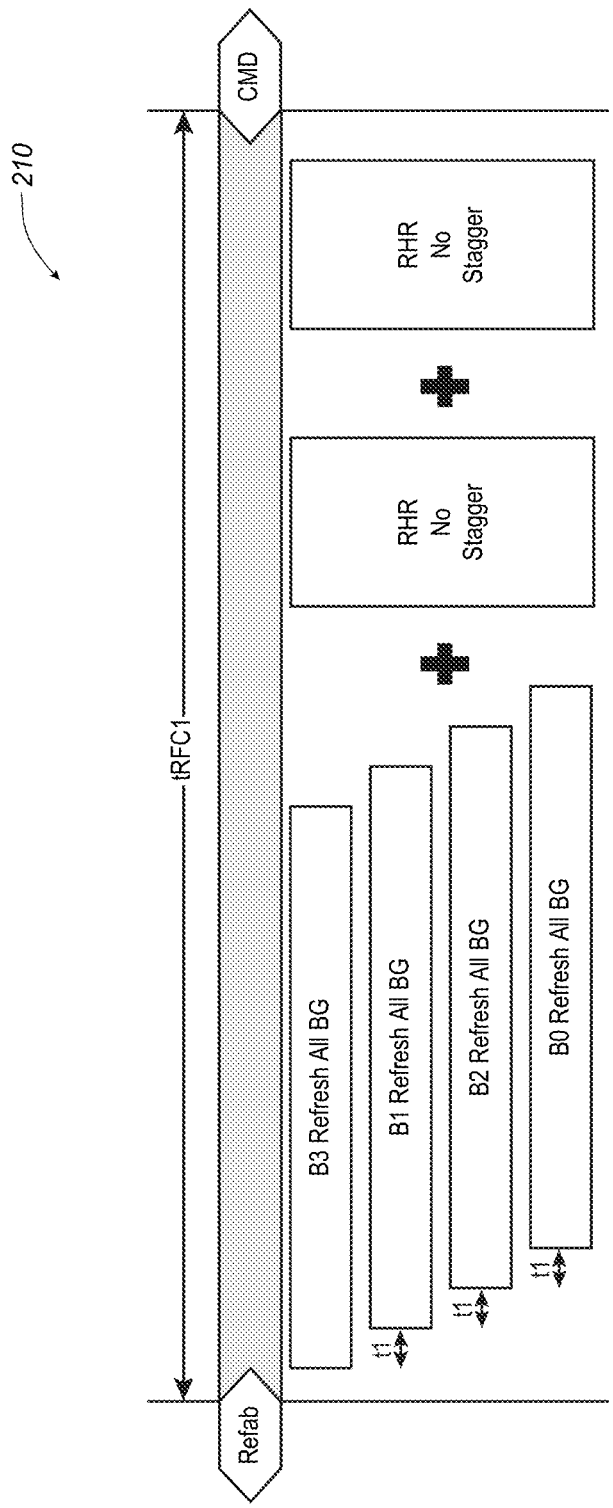
FIG. 2 is a timing diagram of a default response of a memory device to receiving a refresh all banks command in accordance with various embodiments of the present technology.

As explained above, one example of a refresh command is a refresh all banks command REFab. In response to receiving a refresh all banks command REFab, the memory device 100 can proceed to perform several refresh operations to refresh all of the memory banks of its memory array 150. FIG. 2 is a timing diagram 210 of a default response of the memory device 100 to receiving a refresh all banks command REFab. For the sake of clarity and understanding, the memory array 150 of the memory device 100 is discussed with respect to FIG. 2 (and FIGS. 3 and 4 below) as including four memory bank groups B0-B3 with each of the bank groups B0-B3 including a plurality of memory banks. The memory array 150 of the memory device 100 can include a greater or lesser number of memory bank groups in other embodiments.

Referring to FIG. 2, the memory device 100, in response to receiving a refresh all banks command REFab, locks the memory bank groups B0-B3 (e.g., the memory device 100 prevents the memory bank groups B0-B3 from being accessed and/or from being available for other operations) and proceeds to refresh every memory bank of the memory array 150 over a time period tRFC1. In particular, the memory device 100 first staggers refresh operations (e.g., using an array timer 127 of the center logic circuitry 125 of FIG. 1) on the memory bank groups B0-B3 (e.g., to reduce peak power consumed by the memory device 100 while refreshing the memory banks of the memory array 150). For example, the memory device 100 performs a refresh operation (e.g., one or more auto refresh operations and/or one or more RHR operations) on the memory bank group B3, and then performs a refresh operation (e.g., one or more auto refresh operations and/or one or more RHR operation) on the memory bank group B1 a time t1 later while the memory device 100 is performing the refresh operation on the memory bank group B3. Similarly, the memory device 100 performs a refresh operation (e.g., one or more auto refresh operations and/or one or more RHR operation) on the memory bank group B2 a time t1 after performing the refresh operation on the memory bank group B1, and the memory device 100 performs a refresh operation (e.g., one or more auto refresh operations and/or one or more RHR operation) on the memory bank group B0 a time t1 after performing the refresh operation on the memory bank group B2. The times t1 are equivalent such that the staggering of the refresh operations on the memory bank groups B0-B3 is uniform.

Because the refresh operations of the memory bank groups B0-B3 are staggered, there are periods of time shortly after receiving a refresh all banks command REFab and during the time period tRFC1 where one or more of the memory bank groups B0-B3 are not being refreshed. For example, the memory bank groups B0-B2 are not refreshed for at least a time t1 after receiving the refresh all banks command REFab. Indeed, as shown in FIG. 2, the memory bank group B2 is not refreshed for at least two times the time t1 after receiving the refresh all banks command REFab, and the memory bank group B0 is not refreshed for at least three times the time t1 after receiving the refresh all banks command REFab. Thus, for a portion of the time period tRFC1 after receiving a refresh all banks command REFab, the bank groups B0-B2 remain idle (e.g., not currently being used for reading or writing data because the memory array 150 is locked) and not the subject of a refresh operation. Depending at least in part on the duration of the time t1, there may be ample time for the memory device 100 to receive and execute one or more access (e.g., precharge, read, and/or write) and/or other commands on the memory bank groups B0, B1, and/or B2 before the memory device 100 performs a refresh operation on the memory bank groups B0, B1, and/or B2 in response to receiving a refresh all banks command REFab. Thus, depending at least in part on the duration of the time t1, locking the entire memory array 150 in response to receiving a refresh all banks command REFab can constitute a waste of the total time the memory banks B0, B1, and/or B2 remain available for reading and writing data.

Furthermore, as shown in FIG. 2, the memory device 100 can perform two pumps of RHR operations on memory rows (word lines) of memory banks of the memory bank groups B0-B3 following completion of auto refresh operations on the memory bank groups B0-B3. These RHR operations are not staggered, meaning that the RHR operations can be performed on memory banks of any of the memory bank groups B0-B3 during the time period tRFC1 after all of the memory bank groups B0-B3 have been refreshed via the auto refresh operations. In some embodiments, the memory device 100 can use an array timer 127 (e.g., a central array timer) of the center logic circuitry 125 (FIG. 1) to indicate when enough time has elapsed after receiving a refresh all banks command REFab for the memory device 100 to have refreshed all of the memory bank groups B0-B3 in FIG. 2 via auto refresh operations such that the memory device 100 can proceed to perform RHR operations on the memory bank groups B0-B3 before the time period tRFC1 expires.

Because the RHR operations can be performed on any of the memory bank groups B0-B3 in FIG. 2 and because the RHR operations are not performed until all of the memory bank groups B0-B3 have been refreshed via the auto refresh operations, the memory device 100 keeps all of the memory bank groups B0-B3 locked for the entire duration of the time period tRFC1. As shown in FIG. 2, there are therefore periods of time after refreshing the memory bank groups B1-B3 during which the memory bank groups B1-B3 remain idle and not subject to either refresh operations or RHR operations. Thus, depending at least in part on the period of time required for the memory device 100 to refresh a single memory bank group via one or more auto refresh operations, locking the entire memory array 150 for the duration of tRFC1 remaining after refreshing the memory bank groups B1, B2, and/or B3 via one or more auto refresh operations but before performing the RHR pumps can constitute a waste of the total time the memory banks B1, B2, and/or B3 remain available for reading and writing data and/or for other operations. Stated another way, locking the entire memory array 150 for the duration of tRFC1 remaining after refreshing the memory bank groups B1, B2, and/or B3 via one or more auto refresh operations and delaying RHR operations on the memory bank groups B1, B2, and/or B3 until the memory device 100 finishes refreshing the memory bank group B0 can constitute a waste of the total time the memory banks B1, B2, and/or B3 remain available for reading and writing data or for other operations.

To address these concerns, the memory device 100 can, after receiving a (e.g., single) refresh command, receive and execute other commands (e.g., precharge, write, read, and/or other commands) on memory bank groups of the memory array 150 that are idle and not currently the subject of refresh operations while the memory device 100 executes the refresh command. For example, FIGS. 3 and 4 are timing diagrams 310 and 410, respectively, of programmable responses of the memory device 100 to receiving a refresh all banks command REFab in accordance with various embodiments of the present technology.

Figure 3:
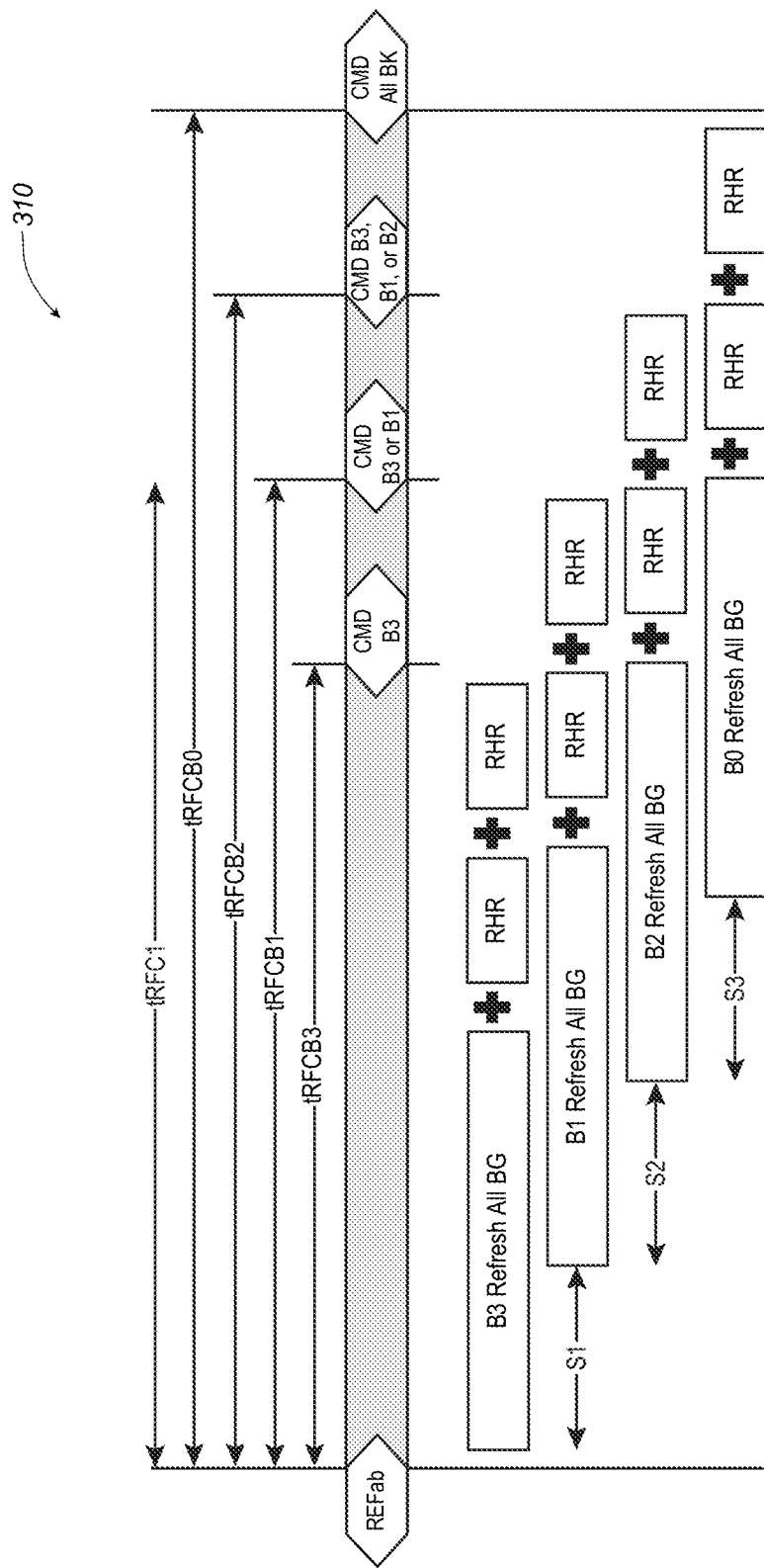
FIGS. 3 and 4 are timing diagrams of programmable responses of a memory device to receiving a refresh all banks command in accordance with various embodiments of the present technology.
Figure 4:
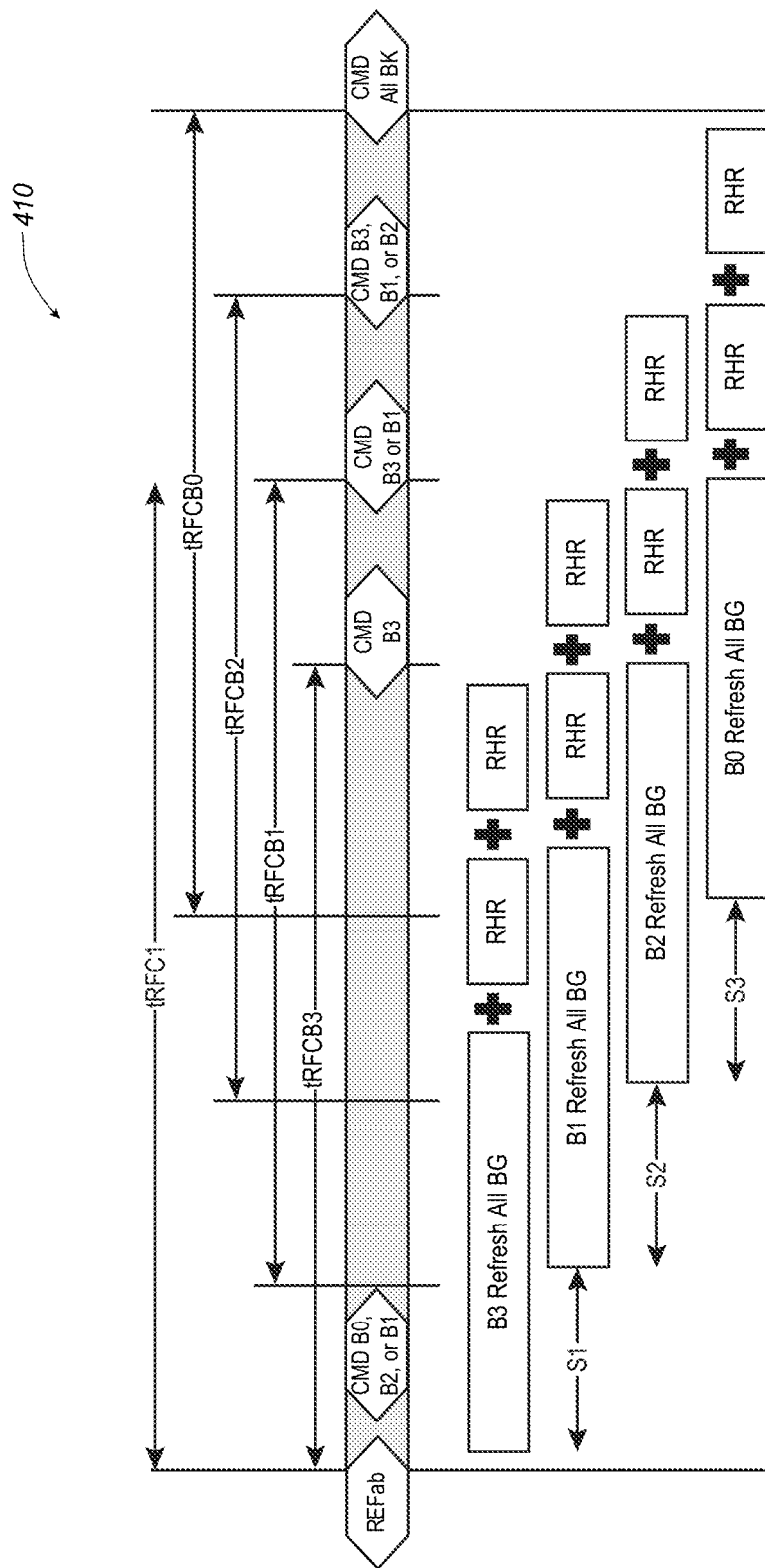

Referring first to FIG. 3, the memory device 100 (e.g., logic coupled to a command/address bus) can, in response to a refresh all banks command REFab, lock the memory bank groups B0-B3 and proceed to perform refresh operations (e.g., auto refresh operations and/or RHR operations) on every memory bank of the memory array 150 similar to the default response illustrated in the timing diagram 210 of FIG. 2. Unlike the default response, however, the memory device 100 (e.g., the logic) can (1) stagger RHR operations such that RHR operations are performed on an individual memory bank group shortly after the memory device 100 finishes performing an auto refresh operation on that memory bank group and (2) unlock the memory bank group for other commands as soon as the memory device 100 finishes performing the RHR operations on that memory bank group.

As a specific example with reference to FIG. 3, the memory device 100 (e.g., the logic) can perform a refresh operation (e.g., an auto refresh operation and/or one or more RHR operations) on the memory bank group B3 in response to receiving a refresh all banks command REFab. In the illustrated embodiments, the memory device 100 performs both an auto refresh operation and RHR operations on the memory bank groups B0-B3. In particular, shortly after the memory device 100 finishes refreshing the memory bank group B3 via an auto refresh command, the memory device 100 can perform RHR operations on the memory bank group B3 without first waiting for the memory device 100 to finish performing auto refresh operations on the other memory bank groups B0-B2. In some embodiments, the memory device 100 (e.g., the logic) can initiate and utilize an array timer 127 (FIG. 1) of the center logic circuitry 125 (FIG. 1) to determine when to perform the RHR operations on the memory bank group B3. The memory device 100 can initiate the array timer 127 when the memory device 100 receives the refresh all banks command REFab and/or when the memory device 100 performs the refresh operation of the memory bank group B3. After the memory device 100 finishes performing the RHR operations on the memory bank group B3, the memory device 100 (e.g., the logic) can unlock the memory bank group B3 and execute various commands CMD B3 (e.g., precharge, read, write, and/or other commands) on the memory bank group B3 without first waiting for the memory device 100 to finish refreshing the other memory bank groups B0-B2. Thus, in this example, the memory bank group B3 is unavailable for only a time period tRFCB3 as opposed to the time period tRFC1 discussed above with respect to FIG. 2. In other words, the memory bank group B3 is available for reading and writing data (or for other operations) more quickly and for a greater total amount of time when the memory device 100 executes the programmable response illustrated in FIG. 3 than when the memory device 100 executes the default response illustrated in FIG. 2.

Continuing with the above example, the memory device 100 (e.g., the logic) also performs (e.g., initiates and/or executes) a refresh operation on the memory bank group B1 a stagger time S1 after performing (e.g., initiating and/or executing) the refresh operation on the memory bank group B3 (e.g., while the memory device 100 is performing the refresh operation on the memory bank group B3). Shortly after the memory device 100 finishes auto refreshing the memory bank group B1, the memory device 100 can perform RHR operations on the memory bank group B1. In some embodiments, the memory device 100 (e.g., the logic) can initiate and utilize an array timer 127 (FIG. 1) of the center logic circuitry 125 (FIG. 1) (e.g., the same or a different array timer 127 of the center logic circuitry 125 than the array timer 127 used for the memory bank group B3) to determine when to perform the RHR operations on the memory bank group B1. The memory device 100 can initiate the array timer 127 when the memory device 100 receives the refresh all banks command REFab, when the memory device 100 performs the refresh operation on the memory bank group B3, and/or when the memory device 100 performs the refresh operation on the memory bank B1. After the memory device 100 finishes performing the RHR operations on the memory bank group B1, the memory device 100 (e.g., the logic) can unlock the memory bank group B1 and execute various commands CMD B3 or B1 (e.g., precharge, read, write, and/or other commands) on either or both of the memory bank groups B3 and/or B1. Thus, in this example, the memory bank group B1 is unavailable for a time period tRFCB1.

The memory device 100 can refresh the memory bank groups B2 and B0 in a manner similar to the memory bank groups B3 and B1 such that the memory bank groups B2 and B0 are unavailable for time periods tRFCB2 and tRFCB0, respectively. For example, one or more array timers 127 (e.g., array timers 127 dedicated to the memory bank groups B2 or B0 and/or array timers 127 shared amongst all or a subset of the memory bank groups B0-B3) can be used to determine when to perform RHR operations on the memory bank groups B2 and B0. The memory device 100 can unlock the memory bank group B2 after the time period TRFCB2 has elapsed, and can execute various commands CMD B3, B1, or B2 (e.g., precharge, read, write, and/or other commands) on any one or more of the memory bank groups B3, B1, and/or B2. After the time period TRFCB0 has elapsed, the memory device can unlock the memory bank group B0 and execute various commands CMD All BK (e.g., precharge, read, write, and/or other commands) on any one or more of the memory bank groups B0-B3.

In some embodiments, the order in which the memory bank groups B0-B3 are refreshed in response to a refresh all banks REFab command can be programmed. For example, one or more bits of one or more mode registers 118 (FIG. 1) of the memory device 100 can be programmed to set the order in which the memory bank groups B0-B3 are refreshed in response to a refresh all banks command REFab. Table 1 below shows one possibility for the programming of a mode register 118 to set a refresh order of the memory bank groups B0-B3:

TABLE 1

| MR Bit | Refresh Order |
| --- | --- |
| 0 | B0, B1, B2, B3 |
| 1 | B1, B2, B3, B0 |
| 2 | B2, B3, B0, B1 |
| 3 | B3, B0, B1, B2 |
| 4 | B3, B2, B1, B0 |
| 5 | B2, B1, B0, B3 |
| 6 | B1, B0, B3, B2 |
| 7 | B3, B1, B2, B0 |

TABLE 1-continued

| MR Bit | Refresh Order |
|---|---|
| 8 | B2, B0, B3, B1 |
| 9 | B1, B3, B0, B2 |

Table 1 above illustrates only 10 of the 24 refresh order possibilities for the memory bank groups B0-B3. Thus, a person of ordinary skill in the art will recognize that other refresh orders than shown in Table 1 are possible and can be programmed into the memory device 100 in addition to or in lieu of one or more of the refresh orders included in Table 1 above using one or more bits of the mode register 118 and/or by using more than one mode register 118.

Referring to Table 1 above as an example, the memory device 100 can be programmed to refresh the memory bank groups B0-B3 in the refresh order illustrated in FIG. 3 by asserting bit 7 of the mode register 118. In this manner, the memory device 100 can be programmed such that the memory bank group B3 is the first memory bank group to become available after receiving a refresh all banks command REFab. In other words, the ability to program the refresh order of the memory bank groups B0-B3 provides flexibility to program the memory device 100 to give preference to particular memory bank groups. By, for example, programming the mode register 118 such that the bit 0 is asserted instead of the bit 7, the memory device 100 can be programmed to refresh the memory bank group B0 first in response to receiving a refresh all banks command REFab such that memory bank group B0 is the first memory bank B0 to become available (e.g., for reading or writing data) after receiving the refresh all banks command REFab and/or such that the memory bank group B0 becomes available more quickly than under the default response illustrated in FIG. 2.

Additionally or alternatively, the order in which the memory bank groups B0-B3 are refreshed in response to a refresh all banks REFab command can be programmed using one or more bits of command signals CMD (FIG. 1) received by the memory device 100. For example, one or more bits of a refresh all banks command REFab can be programmed to specify an order in which to refresh the memory bank groups B0-B3. Table 2 below shows one possibility for programming the refresh order of the memory banks B0-B3 of FIG. 3 using two bits of a refresh all banks command REFab:

TABLE 2

| Command Address Bit 6 Value | Command Address Bit 7 Value | Refresh Order |
|---|---|---|
| 0 | 0 | B0, B3, B1, B2 |
| 0 | 1 | B1, B2, B0, B3 |
| 1 | 0 | B2, B0, B3, B1 |
| 1 | 1 | B3, B1, B2, B0 |

Table 2 above illustrates only 4 of the 24 refresh order possibilities for the memory bank groups B0-B3. Thus, a person of ordinary skill in the art will recognize that other refresh orders than shown in Table 2 are possible and can be programmed into the memory device 100 in addition to or in lieu of one or more of the refresh orders included in Table 2 above using one or more bits of a refresh all banks command REFab.

Referring to Table 2 above as an example, the memory device 100 can be programmed to refresh the memory bank groups B0-B3 in the order illustrated in FIG. 3 by asserting both command address bit 6 and command address bit 7 in a refresh all banks command REFab received by the memory device 100. In this manner, the memory device 100 can be programmed such that the memory bank group B3 is the first memory bank group to become available after receiving the refresh all banks command REFab. As another example, by asserting neither the command address bit 6 nor the command address bit 7 when issuing a refresh all banks command REFab, the memory device 100 can be programmed to refresh the memory bank group B0 first in response to receiving the refresh all banks command REFab such that memory bank group B0 is the first memory bank B0 to become available (e.g., for reading or writing data) after receiving the refresh all banks command REFab and/or such that the memory bank group B0 becomes available more quickly than under the default response illustrated in FIG. 2.

In some embodiments, bits of both the mode register 118 (FIG. 1) and the command signals CMD can be used to program the refresh order of the memory bank groups B0-B3. For example, the memory device 100 can be configured to give preference to the refresh order specified in the mode register 118 over the refresh order specified in a refresh all banks command REFab (or vice versa). As a specific example, the memory device 100 can be configured to refresh the memory bank groups B0-B3 in the order specified in refresh all banks commands REFab received by the memory device 100 unless and/or until the bits of the mode register 118 are programmed, at which point the memory device 100 can be configured to refresh the memory bank groups B0-B3 in the order specified in the mode register 118.

Referring again to FIG. 3, the periods of time tRFC0, tRFC1, and tRFC2 during which the memory bank groups B0, B1, and B2, respectively, are unavailable after receiving a refresh all banks command REFab depend at least in part on stagger times S1, S2, and/or S3 between refresh operations on the memory bank groups B0, B1, and/or B2. In other words, shortening the duration of the stagger times S1, S2, and/or S3 decreases the time the memory bank groups B0, B1, and/or B2 are locked after receiving a refresh all banks command REFab, whereas increasing the duration of the stagger times S1, S2, and/or S3 increases the time the memory bank groups B0, B1, and/or B2 are locked after receiving a refresh all banks command REFab.

In some embodiments, the lengths of the stagger times S1, S2, and/or S3 can be programmed. For example, one or more bits of one or more mode registers 118 (FIG. 1) of the memory device 100 can be programmed to set the stagger times S1, S2, and/or S3. Table 3 below shows one possibility for the programming of a mode register 118 to set the stagger times S1, S2, and S3:

TABLE 3

| MR Bit | Stagger Length (ns) |
|---|---|
| 0 | 5 |
| 1 | 10 |
| 2 | 15 |
| 3 | 20 |
| 4 | 25 |
| 5 | 30 |

Table 3 above illustrates only 6 stagger length possibilities. A person of ordinary skill in the art will recognize that other stagger length possibilities than shown in Table 3 above are possible and can be programmed into the memory device 100 in addition to or in lieu of one or more of the stagger lengths included in Table 3 above using one or more bits of one or more mode registers.

Referring to Table 3 above as an example, the memory device 100 can be programmed to stagger or offset the refresh operations of the memory bank groups B0-B3 of FIG. 3 by 20 ns (e.g., to set S1, S2, and S3 equal to 20 ns) by asserting bit 3 of the mode register 118. In this manner, the memory device 100 (e.g., the logic) can perform a refresh operation on the memory bank group B1 of FIG. 3 20 ns after the memory device 100 (e.g., the logic) performs a refresh operation on the memory bank group B3. Similarly, the memory device 100 can perform a refresh operation on the memory bank group B2 20 ns after performing the refresh operation on the memory bank group B1, and the memory device 100 can perform a refresh operation on the memory bank group B0 20 ns after performing the refresh operation on the memory bank group B2.

As discussed above, the time periods tRFC1, tRFC2, and tRFC0 represent durations of time the memory bank groups B1, B2, and B0, respectively, remain locked after receiving a refresh all banks command REFab. In other words, tRFC1, tRFC2, and tRFC0 represent the amount of time that elapses after receiving a refresh all banks command REFab before the memory bank groups B1, B2, and B3, respectively, become available for reading or writing data or for other operations. Decreasing the stagger times S1, S2, and/or S3 can decrease the time periods tRFC1, tRFC2, and tRFC0 and can therefore make the memory bank groups B1, B2, and/or B3 available more quickly after receiving a refresh all banks command REFab. Continuing with the above example with respect to Table 3, asserting bits 0, 1, or 2 of the mode register 118 would set the stagger times S1, S2, and S3 equal to 5 ns, 10 ns, or 15 ns, respectively, and would make the memory bank groups B1, B2, and B3 available more quickly for reading or writing data for other operations after receiving a refresh all banks command REFab than asserting bit 3 of the mode register 118. On the other hand, asserting bits 4 or 5 of the mode register 118 would set the stagger times S1, S2, and S3 equal to 25 ns or 30 ns, respectively, and would increase the times periods tRFC1, tRFC2, and tRFC0 such that the memory bank groups B1, B2, and B3 would not become available after being refreshed until a point later in time in comparison to the point in time the memory bank groups B1, B2, and B0 would become available after being refreshed by asserting bit 3 of the mode register 118. In other words, the ability to program the stagger times S1, S2, and S3 between refresh operations of the memory bank groups B0-B3 provides flexibility to quicken or delay the point in time at which specific memory bank groups of the memory array 150 become available after being refreshed in response to receiving a refresh all banks command REFab.

In some embodiments, more than one mode register 118 can be used such that the stagger times S1, S2, and/or S3 can be independently programmed. In these embodiments, the stagger times S1, S2, and/or S3 can be programmed such that they are equivalent to or different from one another. Independently programming the stagger times S1, S2, and/or S3 can provide greater granularity for setting the point in time at which a specific memory bank group becomes available after being refreshed in response to receiving a refresh all banks command REFab. In these and other embodiments, one or more bits of command signals CMD (e.g., of a refresh all banks command REFab) received by the memory device 100 can be used to program the stagger times (e.g., in a manner similar to how the one or more bits of command signals CMD can be programmed to set the refresh order, as discussed above).

Each of the stagger times S1, S2, and S3 are discussed above as being measured from a point in time at which a refresh operation is performed on a memory bank group in the memory array 150. For example, the stagger time S1 is discussed above as being measured from the point in time at which a refresh operation is performed on the memory bank group B3, and the stagger time S2 is discussed above as being measured from the point in time at which a refresh operation is performed on the memory bank group B1. In other embodiments, the stagger times can be measured from other points in time. For example, one or more of the stagger times can be measured from the point in time at which the memory device 100 receives a refresh all banks command REFab or from the point in time at which the memory device 100 performs a refresh operation on the first memory bank group (e.g., the memory bank group B3) of the refresh order.

Referring now to FIG. 4, the programmable response illustrated in the timing diagram 410 is similar to the programmable response discussed above with respect FIG. 3 except that the memory device 100 (e.g., the logic) does not lock the entire memory array 150 in response to receiving a refresh all banks command REFab. Instead, the memory device 100 (e.g., the logic) locks the first memory bank group of the programmed refresh order (e.g., the memory bank group B3 in FIG. 4) and locks the remaining memory bank groups depending at least in part on the stagger times S1, S2, and/or S3. For example, if the length of the stagger time S1 is long enough to receive and execute a command (e.g., a precharge, read, write, or other command) on the memory bank group B1 before the memory device 100 (e.g., the logic) performs a refresh operation on the memory bank group B1, the memory device 100 (e.g., the logic) can leave the memory bank group B1 available for a period of time after receiving a refresh all banks command REFab for reading or writing data or for other operations. In some embodiments, the memory device 100 (e.g., the logic) can subsequently lock the memory bank group B1 a time period before performing a refresh operation on the memory bank group B1 (e.g., to provide adequate margin to precharge the memory bank group B1 before performing the refresh operation). On the other hand, if the length of the stagger time S1 is too short to receive and execute a command on the memory bank group B1 before the memory device 100 (e.g., the logic) performs a refresh operation on the memory bank group B1, the memory device 100 (e.g., the logic) can lock the memory bank group B1 immediately upon or a short time after receiving the refresh all banks command REFab.

Similarly, the memory device 100 (e.g., the logic) can leave the memory bank groups B2 and/or B0 available for periods of time after receiving a refresh all banks command REFab for reading or writing data or for other operations depending on the stagger times S1, S2, and/or S3. For example, if the length(s) of the stagger times S1 and/or S2 is/are long enough to receive and execute a command (e.g., a precharge, read, write, or other command) on the memory bank group B2 before the memory device 100 performs a refresh operation on the memory bank group B2, the memory device 100 can leave the memory bank group B2 available for a period of time after receiving a refresh all banks command REFab. Otherwise, the memory device 100 can lock the memory bank group B2 immediately upon or a short time after receiving the refresh all banks command REFab. As another example, if the length(s) of the stagger time S1, S2, and/or S3 is/are long enough to receive and execute a command (e.g., a precharge, read, write, or other command) on the memory bank group B0 before the memory device 100 performs a refresh operation on the memory bank group B0, the memory device 100 can leave the memory bank group B0 available for a period of time after receiving a refresh all banks command REFab. Otherwise, the memory device 100 can lock the memory bank group B0 immediately upon or a short time after receiving the refresh all banks command REFab.

As discussed above, either or both of the refresh order and the stagger times can be programmed. This can provide flexibility for receiving and executing commands (e.g., precharge, read, write, or other commands) on specific memory bank groups of the memory array 150 after receiving a refresh all banks command REFab and before performing refresh operations on one or more of the memory bank groups B0-B3. For example, to provide adequate time to receive and execute a command (e.g., a precharge, read, write, or other command) on the memory bank group B0 after receiving a refresh all banks command REFab, the refresh order of the memory device 100 can be programmed such that the memory device 100 (e.g., the logic) performs refresh operations on each of the other memory bank groups B1-B3 before the memory device 100 (e.g., the logic) performs a refresh operation on the memory bank group B0 (e.g., such that the memory bank group B0 is last in the refresh order). Additionally or alternatively, the stagger times S1, S2, and/or S3 can be programmed to adjust (e.g., delay) the point in time at which the memory device 100 (e.g., the logic) performs a refresh operation on the memory bank group B0. In this manner, the memory device 100 (e.g., the logic) can, after receiving a refresh all banks command REFab and/or while performing refresh operations on other memory bank groups of the memory device 100, receive and execute commands on memory bank groups that are idle and not currently the subject of a refresh operation.

Figure 5:
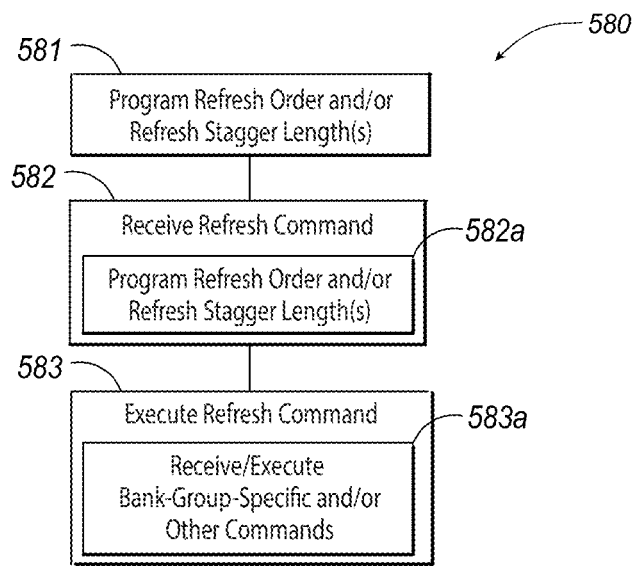
FIG. 5 is a flow diagram illustrating a programmable refresh routine of a memory device and/or a memory system configured in accordance with various embodiments of the present technology.

FIG. 5 is a flow diagram illustrating a programmable refresh routine 580 of a memory device and/or a memory system configured in accordance with various embodiments of the present technology. In some embodiments, the routine 580 can be executed, at least in part, by a memory device, a memory controller operably connected to the memory device, and/or a host device operably connected to the memory controller and/or to the memory device. For example, one or more steps of the routine 580 can be carried out at least in part by components of a memory device, such as a command decoder, center logic circuitry, one or more array timers, one or more mode registers, a row decoder, a column decoder, a memory array, a memory row, a memory bank, a memory bank group, and/or logic connected to a command/address bus. In these and other embodiments, all or a subset of the steps of the routine 580 can be performed by other components of the memory device, by components of the memory controller, by components of the host device, and/or by other components of a memory system containing the memory device.

The routine 580 can begin at block 581 or at block 582. At block 581, the routine 580 programs a refresh order of memory bank groups of a memory device and/or programs one or more stagger lengths between refresh operations on the memory bank groups. For example, the routine 580 can program one or more bits of one or more mode registers to set an order in which routine 580 refreshes memory bank groups in response to receiving a refresh command (e.g., a refresh all banks command REFab). In these and other embodiments, the routine 580 can program one or more bits of one or more mode registers to set lengths of time between refresh operations on memory bank groups immediately adjacent one another in the refresh order. The lengths of time can be programmed such that they are equivalent and such that the refresh operations are uniformly offset from one another, or one or more of the lengths of time can be programmed such that they are different from other programmed lengths of time.

At block 582, the routine 580 receives a refresh command (e.g., a single refresh command, a sequence or series of refresh commands, etc.). For example, the routine 580 can receive a refresh all banks command REFab instructing the routine 580 to refresh every memory bank group of the memory device. In some embodiments, one or more command address bits of the refresh command are used to specify a refresh order and/or one or more stagger lengths for the refresh command. In these embodiments, the routine 580 monitors the one or more command address bits to determine the specified refresh order and/or stagger length(s) and accordingly programs the refresh order and/or the stagger length(s) (block 582a) before proceeding to block 583.

At block 583, the routine 580 executes the refresh command received at block 582 in accordance with the refresh order and/or stagger length(s) programmed at blocks 581 and/or 582a. In the event the refresh command received at block 582 is a refresh all banks command REFab, the routine 580 proceeds to refresh every memory bank group of the memory device. In some embodiments, the routine 580 locks all or a subset of the memory bank groups in response to receiving the refresh command. For example, the routine 580 can lock the first memory bank group specified in the refresh order in response to receiving the refresh command and can proceed to perform a refresh operation (e.g., one or more auto refresh operations and/or one or more RHR operations) on the first memory bank group. In some embodiments, the routine 580 can simultaneously receive and/or execute one or more commands (e.g., precharge, read, write, and/or other commands) on one or more other memory bank groups of the memory device (block 583a), such as a second memory bank group specified in the refresh order or another memory bank group of the memory device. The one or more commands can be bank-group-specific commands (e.g., access commands) and/or other, non-array specific commands.

In the event that the refresh operation includes both an auto refresh operation and RHR operation, the routine 580 can perform the auto refresh operation(s) before the RHR operation(s) (or vice versa). In particular, after performing the auto refresh operation on the first memory bank group specified in the refresh order, the routine 580 can proceed to perform one or more RHR operations on the first memory bank group without first waiting for the routine 580 to refresh other memory bank groups of the memory device. In some embodiments, the routine 580 uses an array timer of the memory device to determine the timing of the RHR operations. The array timer can be dedicated to the first memory bank group and/or shared amongst all or a subset of the memory banks groups of the memory device. Once the routine 580 finishes performing the refresh operation (e.g., the auto refresh operation(s) and/or the RHR operation(s)) on the first memory bank group, the routine 580 can unlock the first memory bank group for reading or writing data or for other operations.

Continuing with the above example, the routine 580 can lock the second memory bank group. For example, the routine 580 can lock the second memory bank group a time period before performing a refresh operation on the second memory bank group (e.g., to precharge the second memory bank group for the refresh operation). Alternatively, the routine 580 can lock the second memory bank group upon receipt of the refresh command at block 582. In some embodiments, whether the routine 580 locks the second memory bank group upon receipt of the refresh command at block 582 or at a time thereafter can depend at least in part on a programmed length of a stagger time between (1) receipt of the refresh command at block 582 or the point in time at which the refresh operation is performed on the first memory bank group and (2) the point in time at which the refresh operation is performed on the second memory bank group or the time period before performing the refresh operation on the second memory bank group.

The routine 580 can proceed to perform a refresh operation (e.g., one or more auto refresh operations and/or one or more RHR operations) on the second memory bank group after the stagger time specified in the one or more programmed stagger lengths has elapsed. The routine 580 can perform the refresh operation on the second memory bank group while the routine 580 is performing a refresh operation on the first memory bank group. Additionally or alternatively, the routine 580 can perform the refresh operation while the routine 580 receives and/or executes one or more commands (e.g., precharge, read, write, and/or other commands) on one or more other memory bank groups of the memory device (block 583a), such as the first memory bank group and/or a third memory bank group specified in the refresh order. The one or more commands can be bank-group-specific commands (e.g., access commands) and/or other, non-array specific commands.

In a specific example, after performing an auto refresh operation on the second memory bank group, the routine 580 can proceed to perform one or more RHR operations on the second memory bank group without first waiting for the routine 580 to refresh other memory bank groups of the memory device. In some embodiments, the routine 580 uses an array timer of the memory device to determine the timing of the RHR operations. The array timer can be dedicated to the second memory bank group and/or shared amongst all or a subset of the memory banks groups of the memory device. Once the routine 580 finishes performing the RHR operations on the second memory bank group, the routine 580 can unlock the second memory bank group for reading or writing data or for other operations.

The routine 580 can proceed to execute the refresh command received at block 582 by performing refresh operations (e.g., one or more auto refresh operations and/or one or more row hammer refresh operations) on one or more other (e.g., remaining) memory bank groups of the memory device consistent with the discussion above. The routine 580 can also simultaneously receive and execute other commands (e.g., precharge, read, write, and/or other commands) on unlocked memory bank groups, such as the first or second memory bank groups or other memory bank groups not currently the subject of a refresh operation.

Although the steps of the routine 580 are discussed and illustrated in a particular order, the method illustrated by the routine 580 in FIG. 5 is not so limited. In other embodiments, the method can be performed in a different order. In these and other embodiments, any of the steps of the routine 580 can be performed before, during, and/or after any of the other steps of the routine 580. Moreover, a person of ordinary skill in the relevant art will readily recognize that the illustrated method can be altered and still remain within these and other embodiments of the present technology. For example, one or more steps of the routine 580 illustrated in FIG. 5 can be omitted and/or repeated in some embodiments. In these and other embodiments, one or more steps of the routine 580 can be combined to form one or more other routines of the memory device.

Figure 6:
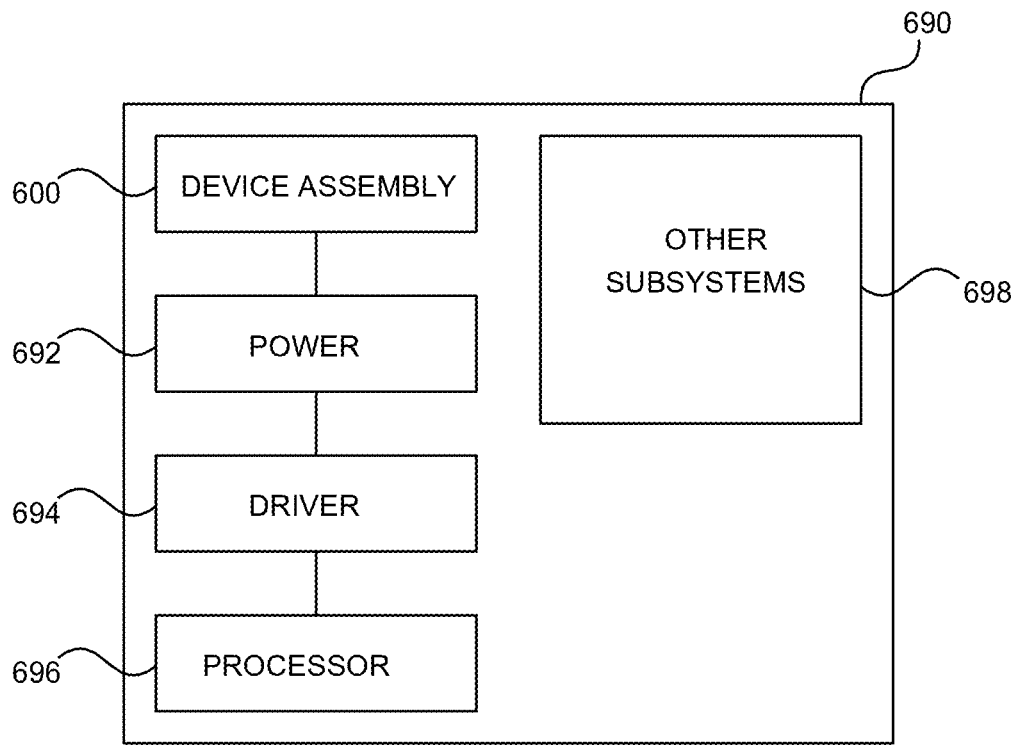
FIG. 6 is a schematic view of a system that includes a memory device configured in accordance with various embodiments of the present technology.

FIG. 6 is a schematic view of a system that includes a memory device in accordance with embodiments of the present technology. Any one of the foregoing memory devices described above with reference to FIGS. 1-5 can be incorporated into any of a myriad of larger and/or more complex systems, a representative example of which is system 690 shown schematically in FIG. 6. The system 690 can include a semiconductor device assembly 600, a power source 692, a driver 694, a processor 696, and/or other subsystems and components 698. The semiconductor device assembly 600 can include features generally similar to those of the memory device described above with reference to FIGS. 1-5, and can, therefore, include various features of memory content authentication. The resulting system 690 can perform any of a wide variety of functions, such as memory storage, data processing, and/or other suitable functions. Accordingly, representative systems 690 can include, without limitation, hand-held devices (e.g., mobile phones, tablets, digital readers, and digital audio players), computers, vehicles, appliances, and other products. Components of the system 690 may be housed in a single unit or distributed over multiple, interconnected units (e.g., through a communications network). The components of the system 690 can also include remote devices and any of a wide variety of computer readable media.

Conclusion

The above detailed descriptions of embodiments of the technology are not intended to be exhaustive or to limit the technology to the precise form disclosed above. Although specific embodiments of, and examples for, the technology are described above for illustrative purposes, various equivalent modifications are possible within the scope of the technology, as those skilled in the relevant art will recognize. For example, while steps are presented and/or discussed in a given order, alternative embodiments can perform steps in a different order. Furthermore, the various embodiments described herein can also be combined to provide further embodiments.

From the foregoing, it will be appreciated that specific embodiments of the technology have been described herein for purposes of illustration, but well-known structures and functions have not been shown or described in detail to avoid unnecessarily obscuring the description of the embodiments of the technology. To the extent any material incorporated herein by reference conflicts with the present disclosure, the present disclosure controls. Where the context permits, singular or plural terms can also include the plural or singular term, respectively. Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Where the context permits, singular or plural terms can also include the plural or singular term, respectively. Furthermore, as used herein, the phrase "and/or" as in "A and/or B" refers to A alone, B alone, and both A and B. Additionally, the terms "comprising," "including," "having" and "with" are used throughout to mean including at least the recited feature(s) such that any greater number of the same feature and/or additional types of other features are not precluded.

From the foregoing, it will also be appreciated that various modifications can be made without deviating from the technology. For example, various components of the technology can be further divided into subcomponents, or that various components and functions of the technology can be combined and/or integrated. Furthermore, although advantages associated with certain embodiments of the technology have been described in the context of those embodiments, other embodiments can also exhibit such advantages, and not all embodiments need necessarily exhibit such advantages to fall within the scope of the technology. Accordingly, the disclosure and associated technology can encompass other embodiments not expressly shown or described herein.

What is claimed is:

1. A method comprising:
   receiving a refresh command;
   in response to the refresh command:
      performing a first refresh operation on a first memory bank group of a memory device at a first time, and
      performing a second refresh operation on a second memory bank group of the memory device at a second time after the first time;
   receiving a read command or a write command after receiving the refresh command; and
   performing, in response to the read command or the write command, a read or write operation on the first memory bank group after beginning the first refresh operation on the first memory bank group and before completing the second refresh operation on the second memory bank group.

2. The method of claim 1, further comprising, in response to the refresh command, offsetting the second time from the first time by a stagger time programmed into one or more mode registers of the memory device.

3. The method of claim 1, further comprising, in response to the refresh command, performing the first and second refresh operations in accordance with an order programmed into one or more mode registers of the memory device and/or specified by one or more command address bits of the single refresh command.

4. The method of claim 1, wherein:
   the first refresh operation and the second refresh operation each include a row hammer refresh (RHR) operation; and
   the method further comprises initiating the RHR operation of the first refresh operation and initiating the RHR operation of the second refresh operation at different times using one or more array timers of the memory device.

5. The method of claim 1, wherein the read or write operation is a first read or write operation, and wherein the method further comprises performing a second read or write operation on the second memory bank group during the first refresh operation.

6. The method of claim 1, wherein performing the read or write operation includes performing the read or write operation on the first memory bank group during the second refresh operation.

7. An apparatus, comprising:
   a memory array including a first memory bank group and a second memory bank group; and
   logic coupled to a command/address bus and to the memory array, wherein the logic is configured to:
      perform, in response to a refresh command received via the command/address bus, a first refresh operation on the first memory bank group at a first time and a second refresh operation on the second memory bank group at a second time after the first time, and
      perform, in response to a read or write command received via the command/address bus, a read or write operation on the first memory bank group, the second memory bank group, or both the first and second memory bank groups after beginning the first refresh operation and before completing the second refresh operation.

8. The apparatus of claim 7, further comprising one or more mode registers, wherein:
   one or more bits of the one or more mode registers are programmable to define a stagger time between the first time and the second time; and
   in response to the refresh command, the logic is further configured to:
      read the one or more bits of the one or more mode registers to determine the stagger time, and
      offset the second time from the first time by the stagger time.

9. The apparatus of claim 7, further comprising one or more mode registers, wherein:
   one or more bits of the one or more mode registers are programmable to define an order in which the first memory bank group and the second memory bank group are to be refreshed in response to the refresh command; and
   in response to the refresh command, the logic is further configured to:
      read the one or more bits of the one or more mode registers to determine the order, and
      perform the first and second refresh operations in accordance with the order.

10. The apparatus of claim 7, wherein:
    the refresh command includes a plurality of command address bits;
    one or more command address bits of the plurality of command address bits specify an order in which the first memory bank group and the second memory bank group are to be refreshed in response to the refresh command; and
    in response to the refresh command, the logic is further configured to:
       read the one or more command address bits to determine the order, and
       perform the first and second refresh operations in accordance with the order.

11. The apparatus of claim 7, wherein the logic is configured to perform the read or write operation on the second memory bank group during the first refresh operation.

12. The apparatus of claim 11, further comprising one or more array timers, wherein:
    the first refresh operation includes a row hammer refresh (RHR) operation; and
    the logic is further configured to, in response to the refresh command, initiate the RHR operation using the one or more array timers.

13. The apparatus of claim 12, wherein:
    the RHR operation is a first RHR operation;
    the second refresh operation includes a second RHR operation; and
    the logic is further configured to, in response to the refresh command, initiate the second RHR operation using the one or more array timers.

14. The apparatus of claim 13, wherein the logic is configured to:
    use a first array timer of the one or more array timers to initiate the first RHR operation; and
    use a second array timer of the one or more array timers different from the first array timer to initiate the second RHR operation.

15. The apparatus of claim 7, wherein the logic is configured to perform the read or write operation on the first memory bank group during the second refresh operation.

16. The apparatus of claim 7, wherein the refresh command is a refresh all banks command (REFab).

17. The apparatus of claim 7, wherein the apparatus is single memory die.

18. A system, comprising:
    a memory controller; and
    a memory device in communication with the memory controller, wherein the memory device includes a first memory bank group and a second memory bank group, and
    wherein:
        the memory controller is configured to issue a refresh command to the memory device instructing the memory device to refresh both the first memory bank group and the second memory bank group,
        in response to the refresh command, the memory device is configured to:
            perform a first refresh operation on the first memory bank group at a first time; and
            perform a second refresh operation on the second memory bank group at a second time after the first time, and
        the memory device is further configured to perform a read or write operation on the first memory bank group, the second memory bank group, or both the first and second memory bank groups after beginning the first refresh operation and before completing the second refresh operation.

19. The system of claim 18, wherein:
    the memory device further includes one or more mode registers;
    the memory controller is further configured to program one or more bits of the one or more mode registers to set a stagger time between the first time and the second time; and
    in response to the refresh command, the memory device is further configured to offset the second time from the first time by the stagger time.

20. The system of claim 18, wherein:
    the memory controller is further configured to:
        program one or more bits of one or more mode registers of the memory device to set an order in which the first memory bank group and the second memory bank group are to be refreshed in response to the refresh command, or
        program one or more command address bits of the refresh command to set the order; and
    in response to the refresh command, the memory device is further configured to:
        read the one or more bits of the one or more mode registers and/or read the one or more command address bits of the refresh command to determine the order, and
        perform the first and second refresh operations in accordance with the order.

* * * * *